(12) United States Patent
Park

(10) Patent No.: US 7,498,847 B2
(45) Date of Patent: Mar. 3, 2009

(54) OUTPUT DRIVER THAT OPERATES BOTH IN A DIFFERENTIAL MODE AND IN A SINGLE MODE

(75) Inventor: Hwan-Wook Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/654,813

(22) Filed: Jan. 18, 2007

(65) Prior Publication Data

US 2007/0176638 A1 Aug. 2, 2007

(30) Foreign Application Priority Data

Feb. 1, 2006 (KR) ........................ 10-2006-0009683

(51) Int. Cl.
*H03K 19/086* (2006.01)
*H03F 1/14* (2006.01)

(52) U.S. Cl. ................. 326/127; 326/121; 326/112; 326/30; 326/83; 330/51; 330/253

(58) Field of Classification Search ............. 326/86, 326/30, 127; 327/108
See application file for complete search history.

(56) References Cited

U.S. PATENT DOCUMENTS

| 6,252,432 | B1 | 6/2001 | Freitas |  |
|---|---|---|---|---|
| 6,275,107 | B1 | 8/2001 | Maeda et al. |  |
| 6,384,682 | B2 | 5/2002 | Maeda et al. |  |
| 6,566,911 | B1 * | 5/2003 | Moyer | 326/83 |
| 6,664,851 | B1 * | 12/2003 | Pihlstrom et al. | 330/51 |
| 6,683,472 | B2 * | 1/2004 | Best et al. | 326/30 |
| 6,700,403 | B1 * | 3/2004 | Dillon | 326/37 |
| 6,788,099 | B2 | 9/2004 | Zakai |  |

FOREIGN PATENT DOCUMENTS

| JP | 2000-138576 | 5/2000 |
|---|---|---|
| JP | 2000-188530 | 7/2000 |

\* cited by examiner

*Primary Examiner*—Vibol Tan
(74) *Attorney, Agent, or Firm*—Mills & Onello, LLP

(57) ABSTRACT

An output driver of a semiconductor memory device that operates in a differential mode and in a single mode is disclosed. The output driver includes a current supplying circuit that operates as a resistor in a single mode and as a current source in a differential mode. Accordingly, the semiconductor memory device including the output driver can have high test efficiency, since the number of test pins utilized during a test operation can be selectively reduced for low frequency tests.

20 Claims, 6 Drawing Sheets

OUTPUT DRIVER THAT OPERATES BOTH IN A DIFFERENTIAL MODE AND IN A SINGLE MODE

CROSS-REFERENCE TO RELATED APPLICATIONS

This application claims priority under 35 USC §119 to Korean Patent Application No. 10-2006-0009683 filed on Feb. 1, 2006, in the Korean Intellectual Property Office (KIPO), the disclosure of which is incorporated herein in its entirety by reference.

BACKGROUND OF THE INVENTION

1. Field of the Invention

The present invention relates to an output driver of a semiconductor memory device, and more particularly to an output driver of a semiconductor memory device capable of operating both in a differential mode and in a single mode.

2. Description of the Related Art

FIG. 1 is a circuit diagram illustrating a conventional output driver.

The output driver of FIG. 1 has a circuit configuration of a differential amplifier and may be used in a system operating at a high frequency of over 800 MHz. According to FIG. 1, when a positive input signal VIP has a logic high state and a negative input signal VIM has a logic low state, a positive output signal VOP has a logic high state and a negative output signal VOM has a logic low state. P-type metal-oxide semiconductor (PMOS) transistors MP1 and MP2 supply a current to an output driver of FIG. 1 in response to a bias voltage VB1. An n-type MOS (NMOS) transistor MN3 is coupled between a node N1 and a low supply voltage and supplies a constant current to the output driver in response to a bias voltage VB2. That is, the NMOS transistor MN3 operates as a current source.

Most function tests, such as those other than a test of input/output the number of pins in a semiconductor device used in the test increases, the number of semiconductor devices that can be tested using a tester in a test system at one time can likewise decrease. During a low frequency test, the output driver does not need to operate in a differential mode, but rather can be operated in a single mode, since the high-frequency characteristics of differential mode are not needed for low frequency tests. When the output driver operates in a single mode, the number of pins that is used in the test may be decreased. A conventional output driver does not take advantage of this.

SUMMARY OF THE INVENTION

Accordingly, the present invention is provided to substantially obviate one or more problems due to limitations and disadvantages of the related art. In particular, the embodiments of the present invention provide an output driver that can operate in a differential mode and in a single mode.

Some embodiments of the present invention provide an output driver that may operate both in a differential mode and in a single mode.

Some embodiments of the present invention provide an amplifying circuit that may operate both in a differential mode and in a single mode.

In one aspect, embodiments of the present invention provide an output driver that includes a first transistor, a second transistor and a first current supplying circuit. The first transistor has an input terminal to which a first input signal is applied, a first output terminal coupled to a first node, and a second output terminal coupled to a first output node. The second transistor has an input terminal to which a second input signal is applied, a first output terminal coupled to the first node, and a second output terminal coupled to a second output node. The first current supplying circuit is coupled to the first node, and operates as a current source in a differential mode, and operates as a resistor in a single mode in response to a mode selecting signal.

In some embodiments, the first current supplying circuit may include a first n-type metal-oxide semiconductor (NMOS) transistor, a second NMOS transistor, an inverter and a p-type MOS (PMOS) transistor.

The first NMOS transistor has a gate to which a bias voltage is applied, a drain coupled to the first node and a source to which a first supply voltage is applied. The second NMOS transistor has a gate to which the mode selecting signal is applied, a drain coupled to the first node and a source to which the first supply voltage is applied. The inverter inverts the mode selecting signal. The PMOS transistor has a gate to which an output signal of the inverter is applied, a source to which a second supply voltage is applied, and a drain coupled to the gate of the first NMOS transistor.

In other embodiments, the first current supplying circuit may include an inverter, a third transistor, a first NMOS transistor, a second NMOS transistor, and a PMOS transistor.

The inverter inverts the mode selecting signal. The third transistor outputs a bias voltage to a second node in response to an output signal of the inverter. The first NMOS transistor has a gate coupled to the second node, a drain coupled to the first node and a source to which a first supply voltage is applied. The second NMOS transistor has a gate to which the mode selecting signal is applied, a drain coupled to the first node and a source to which the first supply voltage is applied. The PMOS transistor has a gate to which an output signal of the inverter is applied, a source to which a second supply voltage is applied, and a drain coupled to the gate of the first NMOS transistor.

In another aspect, embodiments of the present invention provide an amplifying circuit includes a first transistor, a second transistor and a first current supplying circuit.

The first transistor has an input terminal to which a first input signal is applied, a first output terminal coupled to a first node, and a second output terminal coupled to a first output node. The second transistor has an input terminal to which a second input signal is applied, a first output terminal coupled to the first node, and a second output terminal coupled to a second output node. The first current supplying circuit is coupled to the first node, and operates as a current source in a differential mode, and operates as a resistor in a single mode in response to a mode selecting signal.

Therefore, the output driver according to an example embodiment of the present invention can operate both in a differential mode and in a single mode leading to high test efficiency, since the number of test pins utilized during a test operation can be selectively reduced for low frequency tests.

BRIEF DESCRIPTION OF THE DRAWINGS

The foregoing and other objects, features and advantages of the invention will be apparent from the more particular description of embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF EMBODIMENTS

Figure 1:
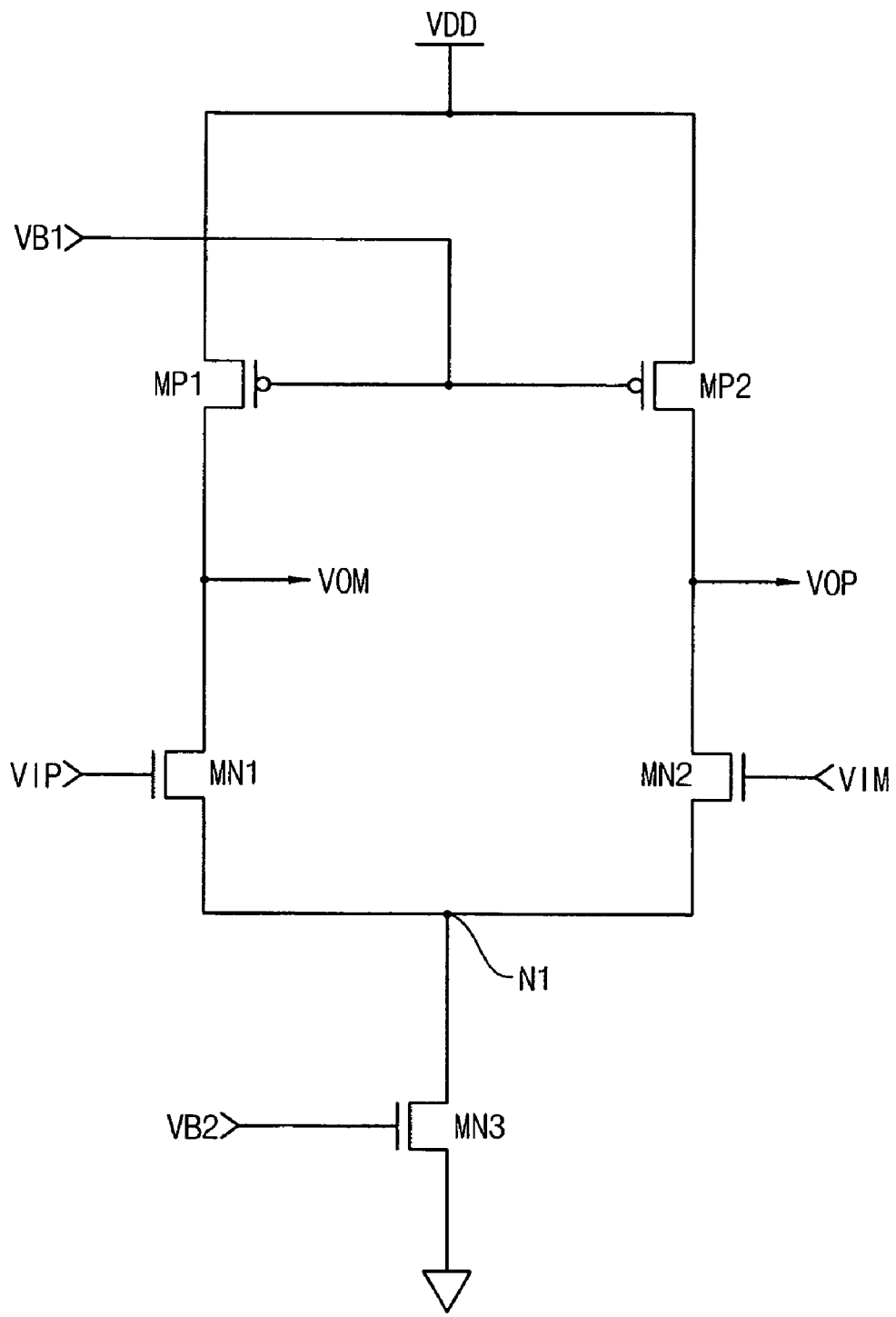
FIG. 1 is a circuit diagram illustrating a conventional output driver.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
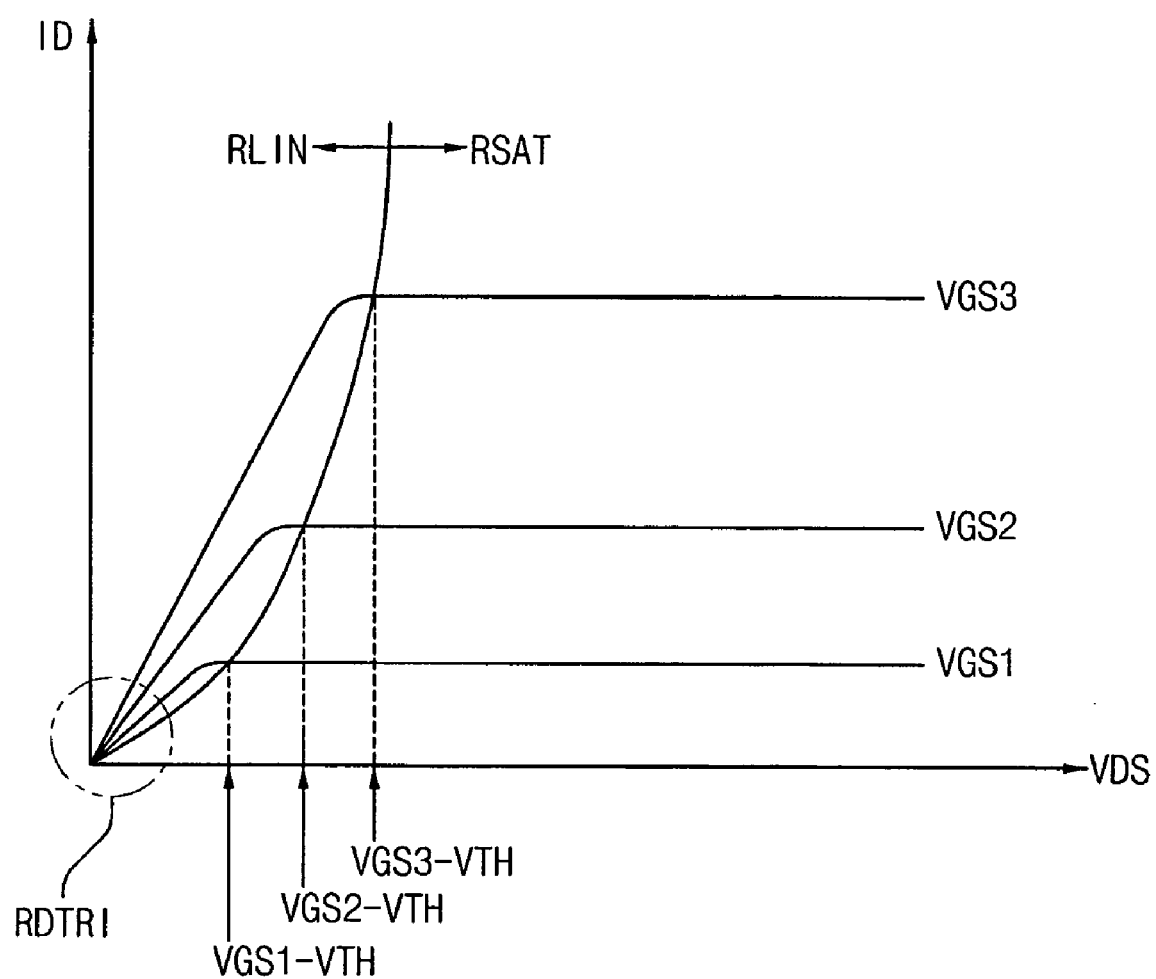
FIG. 2 is a graph illustrating operation regions of a metal-oxide semiconductor (MOS) transistor.

FIG. 2 is a graph illustrating operation regions of a metal-oxide semiconductor (MOS) transistor. In FIG. 2, the operation regions are shown when the gate-to-source voltage VGS has different values VGS1, VGS2 and VGS3. Further, VTH shown in FIG. 2 denotes the threshold voltage of the MOS transistor.

Referring to FIG. 2, the operation regions of the MOS transistor include a linear region RLIN and a saturation region RSAT. The linear region RLIN is the region where the drain current ID changes in linear fashion in response to a change in the drain-to-source voltage VDS. The saturation region RSAT is the region where the drain current ID hardly changes in response to change in the drain-source voltage VDS.

For example, the MOS transistor operates in a saturation region when the gate-to-source voltage VGS has the value VGS1 and the drain-source voltage VDS has a value equal to or greater than VGS1-VTH, and the MOS transistor operates in a linear region when the gate-to-source voltage VGS has the value VGS1 and the drain-source voltage VDS has a value less than VGS1-VTH. In the same manner, the MOS transistor operates in a saturation region when the gate-to-source voltage VGS has the value VGS3 and the drain-source voltage VDS has a value equal to or greater than VGS3-VTH, and the MOS transistor operates in a linear region when the gate-to-source voltage VGS has the value VGS3 and the drain-source voltage VDS has a value less than VGS3-VTH. The linear region, that is the region where the drain current ID is in direct proportion to the drain-to-source voltage VDS, is referred to as a deep triode region (RDTRI). The MOS transistor operates as a resistor in the deep triode region RDTRI.

The first circuit branch comprised of the n-type MOS (NMOS) transistor MN1 and the p-type MOS (PMOS) transistor MP1 and the second circuit branch comprised of the NMOS transistor MN2 and the PMOS transistor MP2 may operate independently when the node N1 of the output driver is directly connected to the ground voltage or when the node N1 of the output driver is connected to the ground voltage through a resistor.

Figure 3:
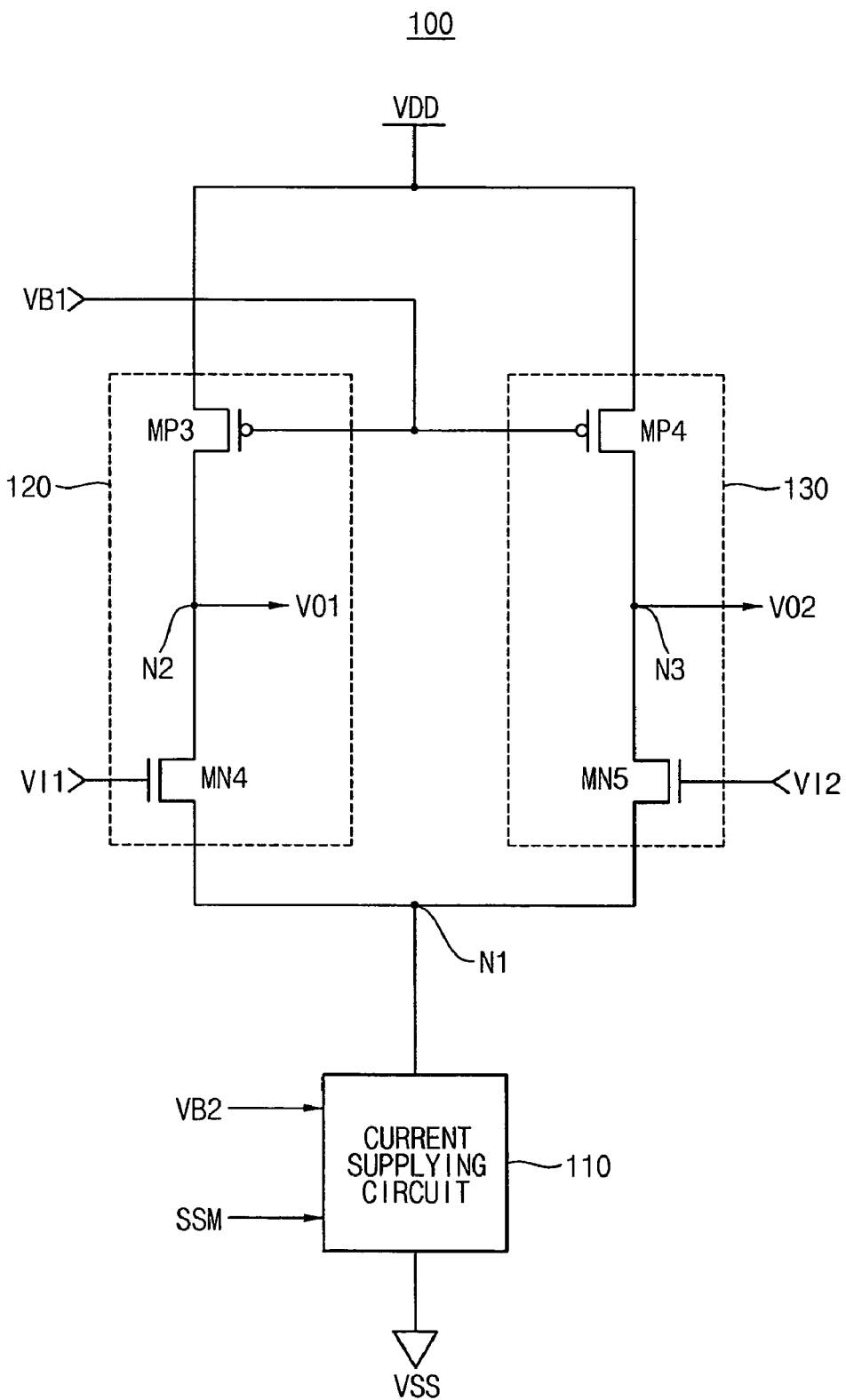
FIG. 3 is a circuit diagram illustrating an output driver according to an example embodiment of the present invention.

FIG. 3 is a circuit diagram illustrating an output driver according to an example embodiment of the present invention.

Referring to FIG. 3, an output driver 100 includes PMOS transistors MP3 and MP4, NMOS transistors MN4 and MN5 and a current supplying circuit 110.

The NMOS transistor MN4 has a gate to which a first input signal VI1 is applied, a source coupled to a node N1 and a drain from which a first output signal VO1 is output. The NMOS transistor MN5 has a gate to which a second input signal VI2 is applied, a source coupled to a node N1 and a drain from which a second output signal VO2 is output. The PMOS transistor MP3 has a gate to which a bias voltage VB1 is applied, a source to which the high supply voltage VDD is applied, and a drain coupled to a drain of the NMOS transistor MN4. The PMOS transistor MP4 has a gate to which a bias voltage VB1 is applied, a source to which the high supply voltage VDD is applied, and a drain coupled to a drain of the NMOS transistor MN5.

The current supplying circuit 110 operates as a current source when the output driver is operating in a differential mode and operates as a resistor when the output driver is operating in a single mode in response to a mode selection signal SSM and a bias voltage VB2.

Hereinafter, the operation of an output driver according to an example embodiment of the present invention will be described with reference to FIG. 3.

The operation of the output driver 100 in a differential mode is as follows. The output driver 100 can have the structure of a differential amplifier when the output driver 100 operates in a differential mode.

The mode selection signal SSM is inactivated and the current supplying circuit 110 operates as a current source in response to the bias voltage VB2. Constant current flows from the node N1 through the current supplying circuit 110 to the low supply voltage VSS. The first output signal VO1 may be decreased and the second output signal VO2 may be increased when the first input signal VI1 is increased and the second input signal VI2 is decreased. On the contrary, the first output signal VO1 may be increased and the second output signal VO2 may be decreased when the first input signal VI1 is decreased and the second input signal VI2 is increased. When the first input signal VI1 has a logic high state and the second input signal VI2 has a logic low state, the first output signal VO1 may have logic low state and the second output signal VO2 may have logic high state. On the contrary, when the first input signal VI1 has a logic low state and the second input signal VI2 has a logic high state, the first output signal VO1 may have logic high state and the second output signal VO2 may have logic low state.

The operation of the output driver 100 in a single mode is as follows.

The current supplying circuit 110 operates as a resistor when the output driver 100 operates in a single mode. Therefore, the first circuit branch 120 comprised of the NMOS transistor MN4 and the PMOS transistor MP3 and the second circuit branch 130 comprised of the NMOS transistor MN5 and the PMOS transistor MP4 can operate independently in the single mode. For example, the circuit branch 120 and the circuit branch 130 can operate as inverters that operate independently from each other.

Among the tests of semiconductor devices, most of the function tests, other than a test of input/output characteristics, can be performed at a low frequency of tens to hundreds of Mbps. For test that can be performed at low frequencies, it is preferred that an output driver not operate in a differential mode because when the output driver operates in a single mode, the number of pins used to test the semiconductor device including the output driver can be decreased.

Figure 4:
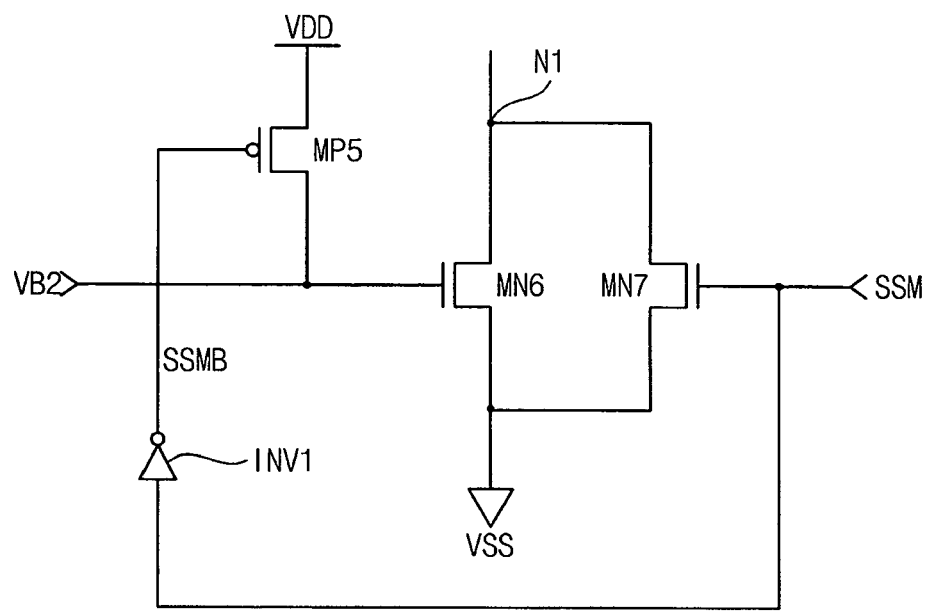
FIG. 4 is a circuit diagram illustrating an example of a current supplying circuit included in the output driver shown in FIG. 3.

FIG. 4 is a circuit diagram illustrating an example of a current supplying circuit included in an output driver shown in FIG. 3.

Referring to FIG. 4, a current supplying circuit 110a includes NMOS transistors MN6 and MN7, a PMOS transistor MP5 and an inverter INV1.

The NMOS transistor MN6 has a gate to which a bias voltage VB2 is applied, a drain coupled to the first node N1 and a source to which the low supply voltage VSS is applied. The NMOS transistor MN7 has a gate to which a mode selecting signal SSM is applied, a drain coupled to the first node N1 and a source to which the low supply voltage VSS is applied. The inverter INV1 inverts the mode selecting signal SSM. The PMOS transistor MP5 has a gate to which an output signal of the inverter INV1 is applied, a source to which a high supply voltage VDD is applied, and a drain coupled to the gate of the NMOS transistor MN6.

Hereinafter, the operation of the current supplying circuit 110a shown in FIG. 4 is described.

The NMOS transistor MN7 may have a smaller size relative to the NMOS transistor MN6. That is, the NMOS transistor MN7 may be designed so that the physical length of the NMOS transistor MN7 has a value that is less than the physical length of the NMOS transistor MN6.

When the mode selecting signal SSM has a logic low state, the NMOS transistor MN7 and the PMOS transistor MP5 are in the off state, and the NMOS transistor MN6 is turned on by the bias voltage VB2. The NMOS transistor MN6 operates in a saturation region, and functions as a current source. Under these conditions, the output driver 100 of FIG. 3 operates in a differential mode.

When the mode selecting signal SSM has a logic high state, the NMOS transistor MN7, the PMOS transistor MP5 and the NMOS transistor MN6 are in the on state. The NMOS transistor MN6 and the NMOS transistor MN7 operate in a deep triode region. That is, the current supplying circuit 110a functions as a resistor. Under these conditions, the output driver of FIG. 3 operates in a single mode, and the first circuit branch 120 and the second circuit branch 130 operate independently from each other.

Figure 5:
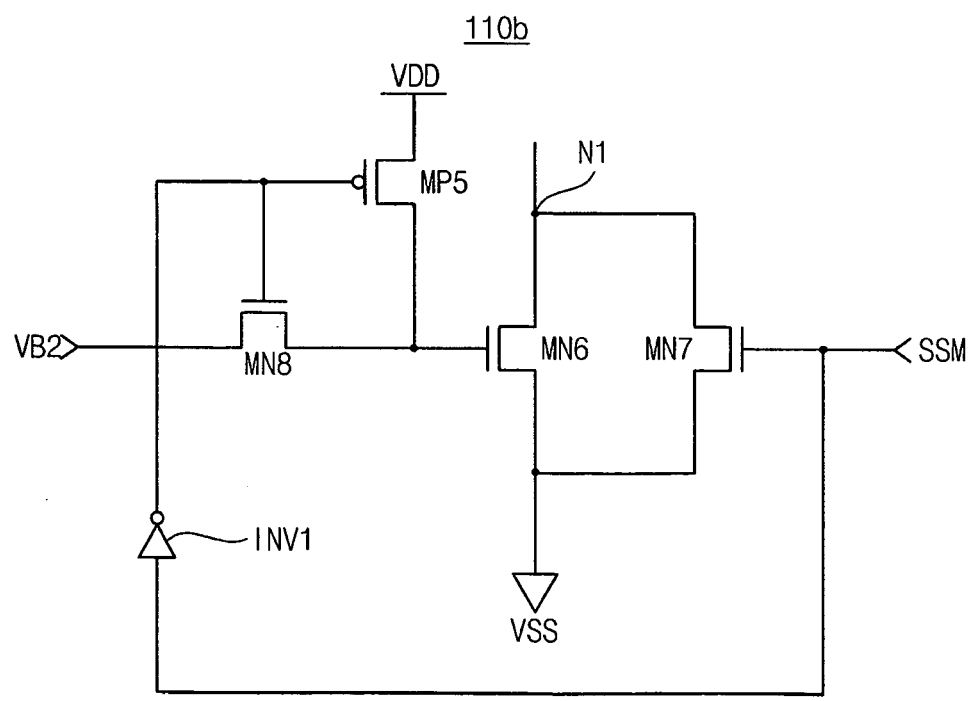
FIG. 5 is a circuit diagram illustrating another example of a current supplying circuit included in the output driver shown in FIG. 3.

FIG. 5 is a circuit diagram illustrating another example of a current supplying circuit that can be included in the output driver shown in FIG. 3.

Referring to FIG. 5, a current supplying circuit 110b includes NMOS transistors MN6, MN7 and MN8, a PMOS transistor MP5 and an inverter INV1.

The inverter INV1 inverts the mode selecting signal SSM. The NMOS transistor MN8 outputs a bias voltage VB2 to the second node, which is a gate of the NMOS transistor MN6, in response to an output signal of the inverter INV1. The NMOS transistor MN6 has a gate coupled to an output terminal of the NMOS transistor MN8, a drain coupled to the first node N1 and a source to which the low supply voltage VSS is applied. The NMOS transistor MN7 has a gate to which a mode selecting signal SSM is applied, a drain coupled to the first node N1 and a source to which the low supply voltage VSS is applied. The PMOS transistor MP5 has a gate to which an output signal of the inverter INV1 is applied, a source to which a high supply voltage VDD is applied, and a drain coupled to the gate of the NMOS transistor MN6.

The circuit of FIG. 5 further includes an additional NMOS transistor MN8 in comparison to the circuit of FIG. 4.

Hereinafter, the operation of the current supplying circuit 110b shown in FIG. 5 is described.

When the mode selecting signal SSM has a logic low state, the NMOS transistor MN7 and the PMOS transistor MP5 are in the off state, the NMOS transistor MN8 is in the on state, and the NMOS transistor MN6 is turned on by the bias voltage VB2. The NMOS transistor MN6 operates in a saturation region, and functions as a current source. Under these conditions, the output driver 100 of FIG. 3 operates in a differential mode.

When the mode selecting signal SSM has a logic high state, the NMOS transistor MN8 is in the off state, and the NMOS transistor MN7, the PMOS transistor MP5 and the NMOS transistor MN6 are in the on state. The NMOS transistor MN6 and the NMOS transistor MN7 operate in a deep triode region. That is, the current supplying circuit 110b functions as a resistor. Under these conditions, the output driver of FIG. 3 operates in a single mode, and the first circuit branch 120 and the second circuit branch 130 operate independently from each other.

Figure 6:
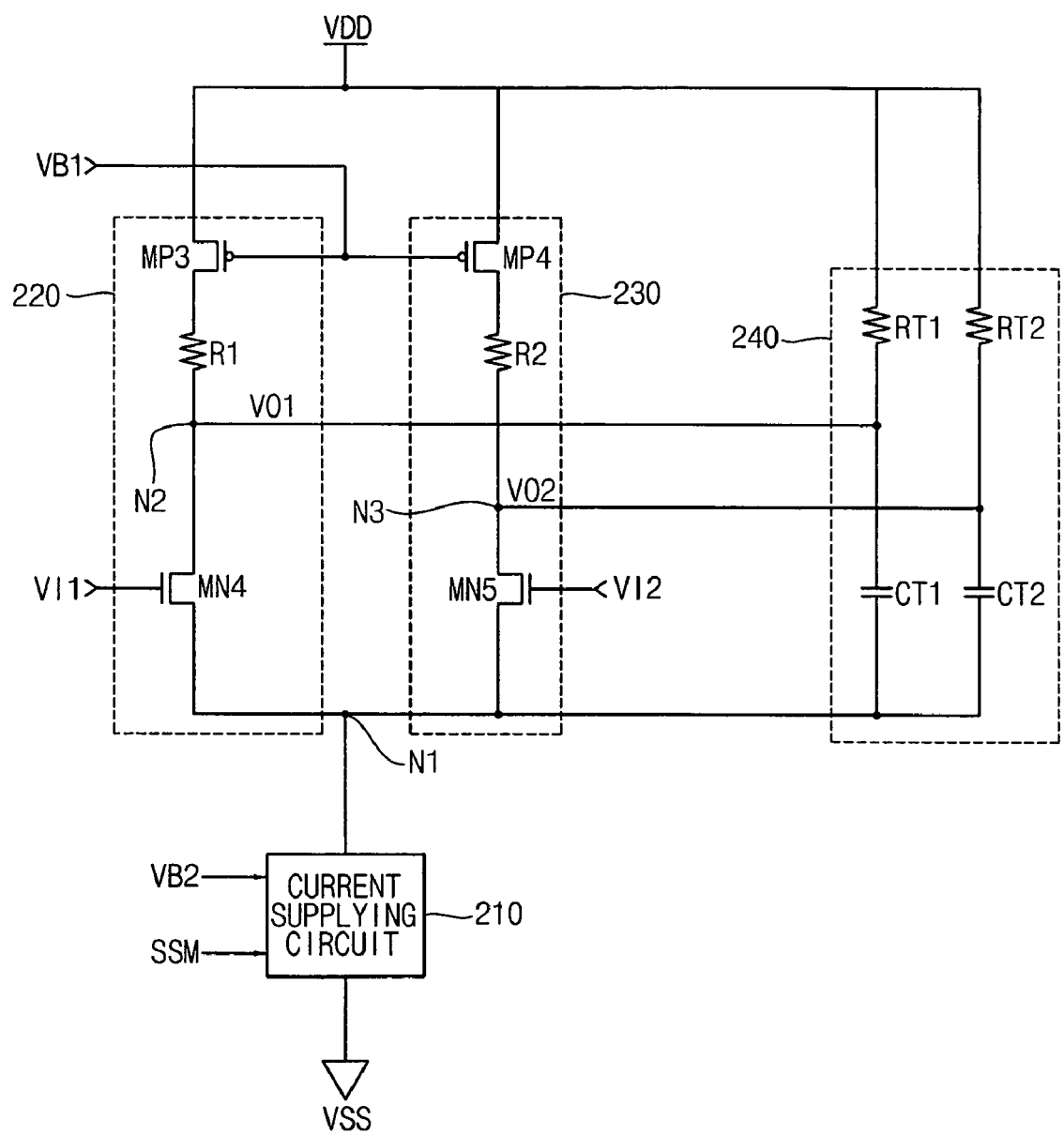
FIG. 6 is a circuit diagram illustrating an output driver according to another example embodiment of the present invention.

FIG. 6 is a circuit diagram illustrating an output driver according to another example embodiment of the present invention. FIG. 6 further includes resistors R1 and R2 and a termination circuit 240. The termination circuit 240 includes termination resistors RT1 and RT2 and termination capacitors CT1 and CT2.

In FIG. 6, the resistor R1 may have the same resistance as that of the termination resistor RT1, and the resistor R2 may have the same resistance as that of the termination resistor RT2.

The output driver 200 of FIG. 6 operates in a manner similar to that of the output driver 100 of FIG. 3. Therefore, the operation of the output driver 200 of FIG. 6 will not be described in detail here.

Figure 7:
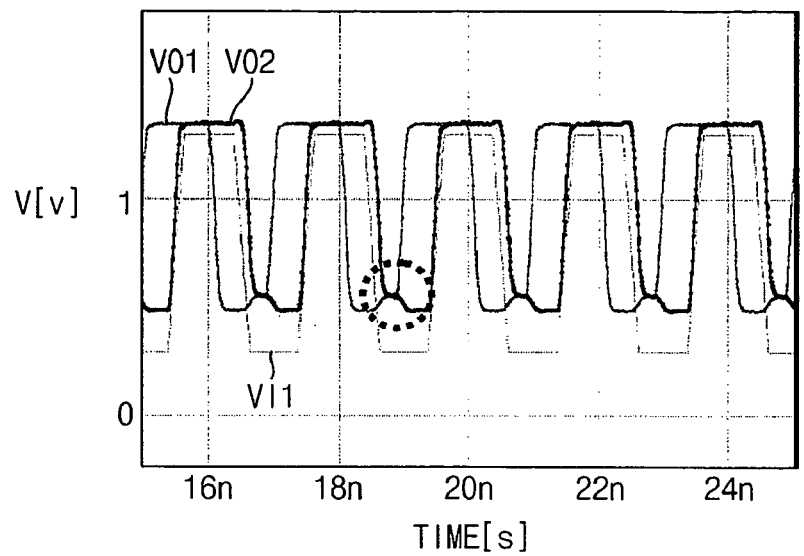
FIG. 7 is a simulation diagram illustrating waveforms of an input voltage and an output voltage when the output driver illustrated in FIG. 6 operates in a single mode.
Figure 8:
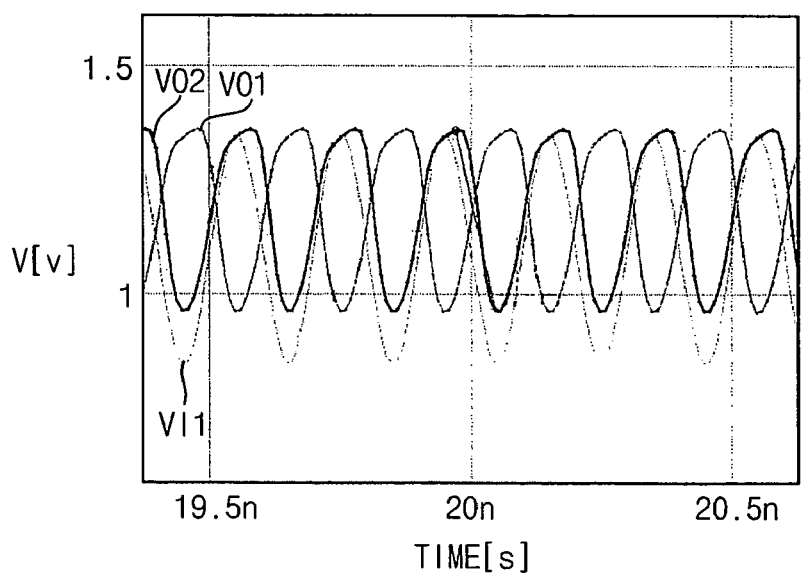
FIG. 8 is a simulation diagram illustrating waveforms of an input voltage and an output voltage when the output driver illustrated in FIG. 6 operates in a differential mode.

FIG. 7 is a simulation diagram illustrating waveforms of an input voltage VI1 and output voltages VO1 and VO2 when the output driver illustrated in FIG. 6 operates in a single mode. FIG. 8 is a simulation diagram illustrating waveforms of an input voltage VI1 and output voltages VO1 and VO2 when the output driver illustrated in FIG. 6 operates in a differential mode. The graph shown in FIG. 7 illustrates the results of a simulation performed under the conditions in which the supply voltage VDD is 1.35 V, the operating speed is 500 Mbps and the termination resistor has a resistance of 50 Ω. The graph shown in FIG. 8 illustrates the results of a simulation performed under the conditions in which the supply voltage VDD is 1.35 V, the operating speed is 5 Gbps and the termination resistor has a resistance of 50 Ω.

Referring to FIG. 7, when the output driver operates in a single mode, the output signal swings by about 800 mV. Though the waveforms of the output signals have some distortions (drawn as a circle), this amount of distortion does not affect the logic levels of the output signals. Further, when the size of the transistor MN6 or MN7 is increased slightly, the distortion of the output signal may be decreased considerably. Referring to FIG. 8, when the output driver operates in a differential mode, the output signal includes a differential pair and swings about 400 mV at a high frequency.

As mentioned above, the output driver according to an example embodiment of the present invention can operate in a differential mode and in a single mode, and therefore a semiconductor device including the output driver can have high test efficiency, since the number of test pins utilized during a test operation can be selectively reduced for low frequency tests.

While the example embodiments of the present invention and their advantages have been described in detail, it should be understood that various changes, substitutions and alterations may be made herein without departing from the scope of the invention.

What is claimed is:

1. An output driver comprising:
a first transistor having an input terminal to which a first input data signal is applied, a first output terminal coupled to a first node, and a second output terminal coupled to a first output node;
a second transistor having an input terminal to which a second input data signal is applied, a first output terminal coupled to the first node, and a second output terminal coupled to a second output node; and
a first current supplying circuit coupled to the first node, the first current supplying circuit operating as a current source when the output driver is in a differential mode, and operating as a resistor when the output driver is in a single mode, wherein the first and second input data signals are applied to the first and second input terminals of the first and second transistors, respectively, during operation in both the differential mode and the single mode, in response to a mode selecting signal.

2. The output driver of claim 1, wherein the first current supplying circuit comprises:
a first n-type metal-oxide semiconductor (NMOS) transistor having a gate to which a bias voltage is applied, a drain coupled to the first node and a source to which a first supply voltage is applied;
a second NMOS transistor having a gate to which the mode selecting signal is applied, a drain coupled to the first node and a source to which the first supply voltage is applied;
an inverter configured to invert the mode selecting signal; and
a p-type MOS (PMOS) transistor having a gate to which an output signal of the inverter is applied, a source to which a second supply voltage is applied, and a drain coupled to the gate of the first NMOS transistor.

3. The output driver of claim 2, wherein the second NMOS transistor is configured to have a smaller size than the first NMOS transistor.

4. The output driver of claim 1, wherein the first current supplying circuit comprises:
an inverter configured to invert the mode selecting signal;
a third transistor configured to output a bias voltage to a second node in response to an output signal of the inverter;
a first NMOS transistor having a gate coupled to the second node, a drain coupled to the first node and a source to which a first supply voltage is applied;
a second NMOS transistor having a gate to which the mode selecting signal is applied, a drain coupled to the first node and a source to which the first supply voltage is applied; and
a PMOS transistor having a gate to which an output signal of the inverter is applied, a source to which a second supply voltage is applied, and a drain coupled to the gate of the first NMOS transistor.

5. The output driver of claim 1, further comprising a second current supplying circuit configured to supply a first current to the first output node and configured to supply a second current to the second output node.

6. The output driver of claim 5, wherein the second current supplying circuit comprises:
a third transistor having a gate to which a first bias voltage is applied, a source to which a first supply voltage is applied, and a drain coupled to the first output node;
a fourth transistor having a gate to which the first bias voltage is applied, a source to which the first supply voltage is applied, and a drain coupled to the second output node.

7. The output driver of claim 1, further comprising:
a first resistor having a first terminal coupled to the first output node;
a second resistor having a first terminal coupled to the second output node;
a third transistor having a gate to which a first bias voltage is applied, a source to which a first supply voltage is applied, and a drain coupled to a second terminal of the first resistor; and
a fourth transistor having a gate to which the first bias voltage is applied, a source to which the first supply voltage is applied, and a drain coupled to a second terminal of the second resistor.

8. The output driver of claim 7, further comprising a termination circuit coupled to the first output node and the second output node.

9. The output driver of claim 8, wherein the termination circuit comprises:

a first termination resistor having a first terminal coupled to the first output node and a second terminal to which the first supply voltage is applied;
a second termination resistor having a first terminal coupled to the second output node and a second terminal to which the first supply voltage is applied;
a first termination capacitor coupled between the first output node and the first node; and
a second termination capacitor coupled between the second output node and the first node.

10. An amplifying circuit comprising:
a first transistor having an input terminal to which a first input data signal is applied, a first output terminal coupled to a first node, and a second output terminal coupled to a first output node;
a second transistor having an input terminal to which a second input data signal is applied, a first output terminal coupled to the first node, and a second output terminal coupled to a second output node; and
a first current supplying circuit coupled to the first node, the first current supplying circuit operating as a current source when the amplifying circuit is in a differential mode, and operating as a resistor when the amplifying circuit is in a single mode, wherein the first and second input data signals are applied to the first and second input terminals of the first and second transistors, respectively, during operation in both the differential mode and the single mode, in response to a mode selecting signal.

11. The amplifying circuit of claim 10, wherein the first current supplying circuit comprises:
a first NMOS transistor having a gate to which a bias voltage is applied, a drain coupled to the first node and a source to which a first supply voltage is applied;
a second NMOS transistor having a gate to which the mode selecting signal is applied, a drain coupled to the first node and a source to which the first supply voltage is applied;
an inverter configured to invert the mode selecting signal; and
a PMOS transistor having a gate to which an output signal of the inverter is applied, a source to which a second supply voltage is applied, and a drain coupled to the gate of the first NMOS transistor.

12. The amplifying circuit of claim 11, wherein the second NMOS transistor is configured to have a smaller size than the first NMOS transistor.

13. The amplifying circuit of claim 10, wherein the first current supplying circuit comprises:
an inverter configured to invert the mode selecting signal;
a third transistor configured to output a bias voltage to a second node in response to an output signal of the inverter;
a first NMOS transistor having a gate coupled to the second node, a drain coupled to the first node and a source to which a first supply voltage is applied;
a second NMOS transistor having a gate to which the mode selecting signal is applied, a drain coupled to the first node and a source to which the first supply voltage is applied; and
a PMOS transistor having a gate to which an output signal of the inverter is applied, a source to which a second supply voltage is applied, and a drain coupled to the gate of the first NMOS transistor.

14. The amplifying circuit of claim 10, further comprising a second current supplying circuit configured to supply a first current to the first output node and configured to supply a second current to the second output node.

15. An output driver comprising:
a first transistor having an input terminal to which a first input signal is applied, a first output terminal coupled to a first node, and a second output terminal coupled to a first output node;
a second transistor having an input terminal to which a second input signal is applied, a first output terminal coupled to the first node, and a second output terminal coupled to a second output node; and
a first current supplying circuit coupled to the first node, and configured to operate as a current source in a differential mode, and configured to operate as a resistor in a single mode in response to a mode selecting signal, wherein the first current supplying circuit comprises:
a first n-type metal-oxide semiconductor (NMOS) transistor having a gate to which a bias voltage is applied, a drain coupled to the first node and a source to which a first supply voltage is applied;
a second NMOS transistor having a gate to which the mode selecting signal is applied, a drain coupled to the first node and a source to which the first supply voltage is applied;
an inverter configured to invert the mode selecting signal; and
a p-type MOS (PMOS) transistor having a gate to which an output signal of the inverter is applied, a source to which a second supply voltage is applied, and a drain coupled to the gate of the first NMOS transistor.

16. The output driver of claim 15, wherein the second NMOS transistor is configured to have a smaller size than the first NMOS transistor.

17. An output driver comprising:
a first transistor having an input terminal to which a first input signal is applied, a first output terminal coupled to a first node, and a second output terminal coupled to a first output node;
a second transistor having an input terminal to which a second input signal is applied, a first output terminal coupled to the first node, and a second output terminal coupled to a second output node; and
a first current supplying circuit coupled to the first node, and configured to operate as a current source in a differential mode, and configured to operate as a resistor in a single mode in response to a mode selecting signal, wherein the first current supplying circuit comprises:
an inverter configured to invert the mode selecting signal;
a third transistor configured to output a bias voltage to a second node in response to an output signal of the inverter;
a first NMOS transistor having a gate coupled to the second node, a drain coupled to the first node and a source to which a first supply voltage is applied;
a second NMOS transistor having a gate to which the mode selecting signal is applied, a drain coupled to the first node and a source to which the first supply voltage is applied; and
a PMOS transistor having a gate to which an output signal of the inverter is applied, a source to which a second supply voltage is applied, and a drain coupled to the gate of the first NMOS transistor.

18. An output driver comprising:
a first transistor having an input terminal to which a first input signal is applied, a first output terminal coupled to a first node, and a second output terminal coupled to a first output node;

a second transistor having an input terminal to which a second input signal is applied, a first output terminal coupled to the first node, and a second output terminal coupled to a second output node; and a first current supplying circuit coupled to the first node, and configured to operate as a current source in a differential mode, and configured to operate as a resistor in a single mode in response to a mode selecting signal;

a first resistor having a first terminal coupled to the first output node;

a second resistor having a first terminal coupled to the second output node;

a third transistor having a gate to which a first bias voltage is applied, a source to which a first supply voltage is applied, and a drain coupled to a second terminal of the first resistor; and a fourth transistor having a gate to which the first bias voltage is applied, a source to which the first supply voltage is applied, and a drain coupled to a second terminal of the second resistor, wherein the output driver further comprises a termination circuit coupled to the first output node and the second output node, wherein the termination circuit comprises:

a first termination resistor having a first terminal coupled to the first output node and a second terminal to which the first supply voltage is applied;

a second termination resistor having a first terminal coupled to the second output node and a second terminal to which the first supply voltage is applied;

a first termination capacitor coupled between the first output node and the first node; and a second termination capacitor coupled between the second output node and the first node.

19. An amplifying circuit comprising:

a first transistor having an input terminal to which a first input signal is applied, a first output terminal coupled to a first node, and a second output terminal coupled to a first output node;

a second transistor having an input terminal to which a second input signal is applied, a first output terminal coupled to the first node, and a second output terminal coupled to a second output node; and a first current supplying circuit coupled to the first node, and configured to operate as a current source in a differential mode, and configured to operate as a resistor in a single mode in response to a mode selecting signal, wherein the first current supplying circuit comprises:

a first NMOS transistor having a gate to which a bias voltage is applied, a drain coupled to the first node and a source to which a first supply voltage is applied;

a second NMOS transistor having a gate to which the mode selecting signal is applied, a drain coupled to the first node and a source to which the first supply voltage is applied;

an inverter configured to invert the mode selecting signal; and a PMOS transistor having a gate to which an output signal of the inverter is applied, a source to which a second supply voltage is applied, and a drain coupled to the gate of the first NMOS transistor, wherein the second NMOS transistor is configured to have a smaller size than the first NMOS transistor.

20. An amplifying circuit comprising:

a first transistor having an input terminal to which a first input signal is applied, a first output terminal coupled to a first node, and a second output terminal coupled to a first output node;

a second transistor having an input terminal to which a second input signal is applied, a first output terminal coupled to the first node, and a second output terminal coupled to a second output node; and a first current supplying circuit coupled to the first node, and configured to operate as a current source in a differential mode, and configured to operate as a resistor in a single mode in response to a mode selecting signal, wherein the first current supplying circuit comprises:

an inverter configured to invert the mode selecting signal;

a third transistor configured to output a bias voltage to a second node in response to an output signal of the inverter;

a first NMOS transistor having a gate coupled to the second node, a drain coupled to the first node and a source to which a first supply voltage is applied;

a second NMOS transistor having a gate to which the mode selecting signal is applied, a drain coupled to the first node and a source to which the first supply voltage is applied; and a PMOS transistor having a gate to which an output signal of the inverter is applied, a source to which a second supply voltage is applied, and a drain coupled to the gate of the first NMOS transistor.

* * * * *